(12) United States Patent
Takakura (10) Patent No.: US 11,538,745 B2
(45) Date of Patent: Dec. 27, 2022

(54) SEMICONDUCTOR DEVICE (71) Applicant: Mitsubishi Electric Corporation, Tokyo (JP)

(72) Inventor: Kazuki Takakura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/375,929

(22) Filed: Jul. 14, 2021

(65) Prior Publication Data

US 2022/0084918 A1 Mar. 17, 2022

(30) Foreign Application Priority Data

Sep. 16, 2020 (JP) .............................. JP2020-155450

(51) Int. Cl.
*H01L 23/495* (2006.01)
*H01L 23/34* (2006.01)
*H01L 25/18* (2006.01)
*H01L 23/00* (2006.01)

(52) U.S. Cl.
CPC ........ *H01L 23/49579* (2013.01); *H01L 23/34* (2013.01); *H01L 23/49555* (2013.01); *H01L 24/73* (2013.01); *H01L 25/18* (2013.01); *H01L 2224/73265* (2013.01)

(58) Field of Classification Search
CPC ............... H01L 23/49579; H01L 23/34; H01L 23/49555; H01L 24/73; H01L 25/18; H01L 2224/73265
See application file for complete search history.

(56) References Cited

U.S. PATENT DOCUMENTS

2007/0200194 A1\* 8/2007 Graf ........................ H01L 24/05
257/469

FOREIGN PATENT DOCUMENTS

JP 2004-128355 A 4/2004
JP 2008-103434 A 5/2008

\* cited by examiner

*Primary Examiner* — Peniel M Gumedzoe
(74) *Attorney, Agent, or Firm* — Studebaker & Brackett PC (57) ABSTRACT A semiconductor device includes at least one member that is partially sealed by a sealing material and has a part of thereof being exposed from the sealing material, a reversible temperature indicating material, and an irreversible temperature indicating material. Each of the reversible temperature indicating material and the irreversible temperature indicating material is provided on a surface of any one of the at least one member.

20 Claims, 4 Drawing Sheets

FIG. 6 ered to as a lead terminal 100 unless the
SEMICONDUCTOR DEVICE

BACKGROUND OF THE INVENTION

Field of the Invention

The present disclosure relates to a semiconductor device.

Description of the Background Art

In semiconductor devices, heat generation is a significant problem. For example, in power semiconductor modules, use under high temperature leads to breakdown, and thus a protection function and use conditions of temperatures are standardized in each product.

As a checking method of temperature of a semiconductor chip in a semiconductor device, Japanese Patent Application Laid-Open No. 2008-103434 discloses a technology providing a temperature indicating material on a suspension lead in order to simply and accurately evaluate the temperature of the semiconductor chip that is sealed with resin.

Japanese Patent Application Laid-Open No. 2008-103434 describes a configuration of providing a temperature indicating material on a suspension lead. There is a problem in that, because information of internal temperature when electric conduction is performed is simply visualized with change of colors, it is difficult to visualize temperature change for two or more different purposes.

SUMMARY

The present disclosure has an object to provide a semiconductor device that enable visualization of internal temperature for two or more different purposes.

A semiconductor device according to the present disclosure includes: at least one semiconductor chip; a sealing material integrally sealing the at least one semiconductor chip; at least one member, each being partially sealed by the sealing material and having a part being exposed from the sealing material; a reversible temperature indicating material; and an irreversible temperature indicating material. Each of the reversible temperature indicating material and the irreversible temperature indicating material is provided on a surface of any one of the at least one member.

Because each of the reversible temperature indicating material and the irreversible temperature indicating material is provided on a surface of any one of the at least one member, internal temperature can be visualized for two or more different purposes.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

A. First Embodiment

<A-1. Configuration and Operation>

Figure 1A:
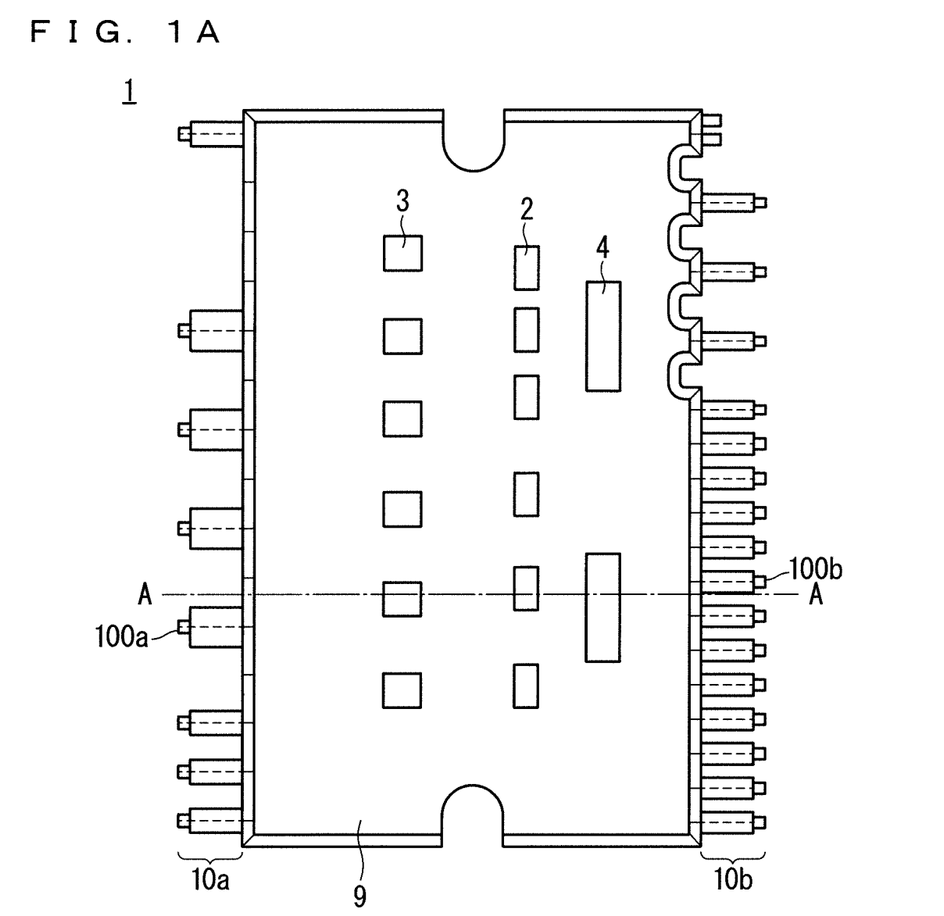
FIG. 1A is a top view of a semiconductor device according to the first embodiment.
Figure 1B:
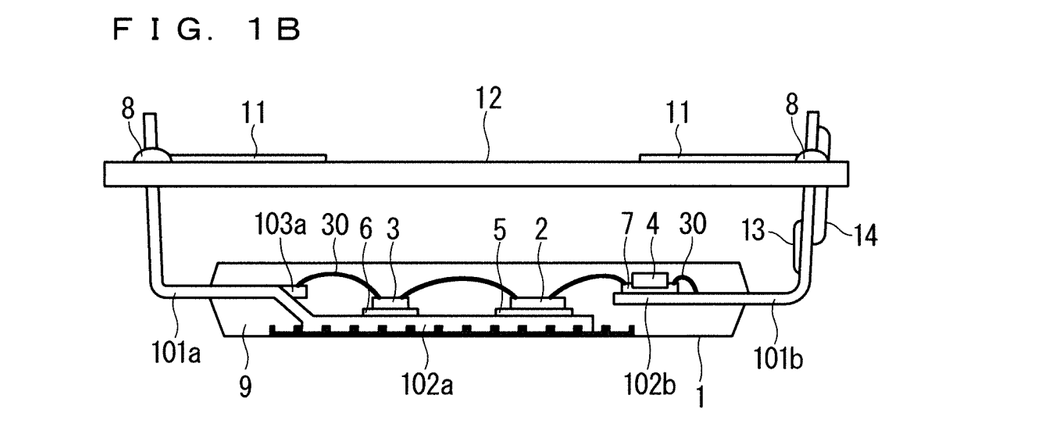
FIG. 1B is a cross-sectional view of the semiconductor device according to the first embodiment.

FIG. 1A is a top view of a semiconductor device 1, and FIG. 1B is a cross-sectional view taken along the line A-A of FIG. 1A. For the sake of description, in FIG. 1B, elements not present in the cross section are illustrated as well.

As illustrated in FIG. 1A, the semiconductor device 1 includes power semiconductor chips 2 and 3, control ICs 4, a lead frame 10a, a lead frame 10b, and a mold resin 9.

FIG. 1A illustrates an example of a case in which the semiconductor device 1 includes a plurality of power semiconductor chips 2, a plurality of power semiconductor chips 3, and a plurality of control ICs 4. However, the number of power semiconductor chips 2 and 3 and control ICs 4 may be any number. Further, the present embodiment illustrates a case in which the power semiconductor chips 2 and 3 and the control ICs 4 are included as the semiconductor chips on the assumption that the semiconductor device 1 is a power semiconductor module. However, it is only necessary that the semiconductor device 1 include at least one semiconductor chip.

The mold resin 9 is a sealing material, and the power semiconductor chips 2 and 3 as the semiconductor chips included in the semiconductor device 1 and the control ICs 4 are integrally sealed by the mold resin 9.

The lead frame 10a includes a plurality of lead terminals 100a. The lead frame 10b includes a plurality of lead terminals 100b. Each of the lead terminal 100a or the lead terminal 100b is referred to as a lead terminal 100 unless the lead terminal 100a and the lead terminal 100b need to be distinguished from each other.

A lead terminal 101a being one of the lead terminals 100a includes a die pad 102a, and the power semiconductor chips 2 and 3 are respectively joined to the die pad 102a by joining materials 5 and 6. A lead terminal 103a being the lead terminal 100a other than the lead terminal 101a is connected to the power semiconductor chips 2 and 3 with a wire 30 being a fine metal wire.

A lead terminal 101b being one of the lead terminals 100b includes a die pad 102b, and the control ICs 4 are joined to the die pad 102b with a joining material 7. The lead terminal 100b (referred to as a lead terminal 103b) other than the lead terminal 101b is connected to the control ICs 4 with the wire 30.

The joining materials 5, 6, and 7 are each a solder, for example.

Each lead terminal 100 is partially sealed by the mold resin 9, and has a part thereof being exposed from the mold resin 9.

The semiconductor device 1 is inserted into a substrate 12, and is connected to a substrate pattern 11 of the substrate 12 by using a joining material 8. What includes the substrate 12 may be referred to as a semiconductor device 1. The joining material 8 is a solder, for example.

In the semiconductor device 1, as illustrated in FIG. 1, both of two temperature indicating materials 13 and 14 having different properties are provided on one or more surfaces of the lead terminals 100. In other words, there are one or more lead terminals 100 in which both of the temperature indicating materials 13 and 14 are provided. There may be a plurality of lead terminals 100 in which both of the temperature indicating materials 13 and 14 are provided. The temperature indicating materials 13 and 14 are provided on an exposed surface, that is, a surface of a part exposed from the mold resin 9, of the lead terminals 100.

Regarding the two temperature indicating materials 13 and 14 having different properties, for example, the temperature indicating material 13 is an irreversible temperature indicating material, and the temperature indicating material 14 is a reversible temperature indicating material. The following description will be given based on the assumption that the temperature indicating material 13 is an irreversible temperature indicating material, and the temperature indicating material 14 is a reversible temperature indicating material.

The temperature indicating materials 13 and 14 are coating materials, for example, and are applied to the surface of the lead terminals 100, and are provided on the surface of the lead terminals 100. Further, the temperature indicating materials 13 and 14 are stickers, for example, and are attached to the surface of the lead terminals 100, and are provided on the surface of the lead terminals 100.

Both of the reversible and irreversible temperature indicating materials 13 and 14 are provided on the surface of one or more lead terminals 100 of the semiconductor device 1, and colors thereof are changed based on the temperature inside the mold resin 9. Through selection of materials for the temperature indicating materials, the temperature at which the colors of the reversible and irreversible temperature indicating materials change can be freely set according to purposes. The temperature at which the color of the reversible temperature indicating material changes and the temperature at which the color of the irreversible temperature indicating material changes may be the same or may be different.

By providing the temperature indicating materials 13 and 14 on the surface of the lead terminal 101*b* joined to at least any one of the control ICs 4 as illustrated in FIG. 1, heat generation of the at least any one of the control ICs 4 can be continuously visualized, and can further be kept as a history. By providing the temperature indicating materials 13 and 14 on the surface of the lead terminal 101*a* joined to at least any one of the power semiconductor chips 2 and 3, heat generation of the at least any one of the power semiconductor chips 2 and 3 can be continuously visualized, and can further be kept as a history. Instead of the heat generation of the power semiconductor chips 2 and 3 or the control ICs 4, heat generation of the lead terminal 101*b* and the lead terminal 101*a* may be continuously visualized, and may further be kept as a history.

The temperature indicating materials 13 and 14 may be provided on the surface of the lead terminals 100 not including the die pad, that is, the lead terminal 103*a* and the lead terminal 103*b*, so that heat generation of the lead terminals 100 may be continuously visualized, and may further be kept as a history.

It is conceivable that tip end portions of the lead terminals 100 are exposed to high temperature at the time of soldering when the semiconductor device 1 is mounted on the substrate 12. It is preferable that the irreversible temperature indicating material 13 be provided at base ends of the lead terminals 100 as illustrated in FIG. 1. The irreversible temperature indicating material 13 is, for example, provided on the lead terminals 100 whose part is exposed in a manner of projecting from the mold resin 9, on a surface of a part closer to the mold resin 9 than to a tip end of the part projecting from the mold resin 9.

By using both of the reversible temperature indicating material 14 and the irreversible temperature indicating material 13, with the reversible temperature indicating material 14, whether internal temperature reaches specific temperature can be continuously visualized, internal initial failure, aging, and the like can be checked, and with the irreversible temperature indicating material 13, the record of reaching the specific temperature can be kept as a history. In this manner, by using the reversible and irreversible temperature indicating materials, internal temperature can be visualized for two or more different purposes. By providing the reversible temperature indicating material 14 and the irreversible temperature indicating material 13 on the surface of the same lead terminal 100, difference of temperatures between the reversible temperature indicating material 14 and the irreversible temperature indicating material 13 can be reduced.

The temperature of the semiconductor device 1 can also be measured by using a device such as a thermal camera. However, internal temperature and surface temperature of the mold resin 9 are different, and thus it is difficult to accurately measure the internal temperature with a thermal camera or the like. By using the reversible temperature indicating material 14 and the irreversible temperature indicating material 13 provided on the lead terminals 100, the internal temperature of the mold resin 9 can be accurately visualized, and can further be kept as a history.

<A-2. Effects>

The semiconductor device 1 includes at least one lead terminal 100, each being partially sealed by the mold resin 9 and having a part thereof being exposed from the sealing material. Each of the reversible temperature indicating material 14 and the irreversible temperature indicating material 13 is provided on a surface of any one of the at least one lead terminal 100. With this configuration, internal temperature can be visualized for two or more different purposes.

Each of the reversible temperature indicating material 14 and the irreversible temperature indicating material 13 is provided on a surface of a part exposed from the mold resin 9 of the at least one lead terminal 100. With this configuration, internal temperature can be visualized for two or more different purposes.

Both of the reversible temperature indicating material 14 and the irreversible temperature indicating material 13 are provided on a surface of the same lead terminal 100. With this configuration, difference of temperatures between the reversible temperature indicating material 14 and the irreversible temperature indicating material 13 can be reduced.

The irreversible temperature indicating material 13 is provided on the lead terminal 100 whose part is exposed in a manner of projecting from the mold resin 9, on a surface of a part closer to the mold resin 9 of the part projecting from the mold resin 9. With this configuration, exposure of the irreversible temperature indicating material 13 to high temperature at the time of soldering can be reduced.

B. Second Embodiment

Figure 2:
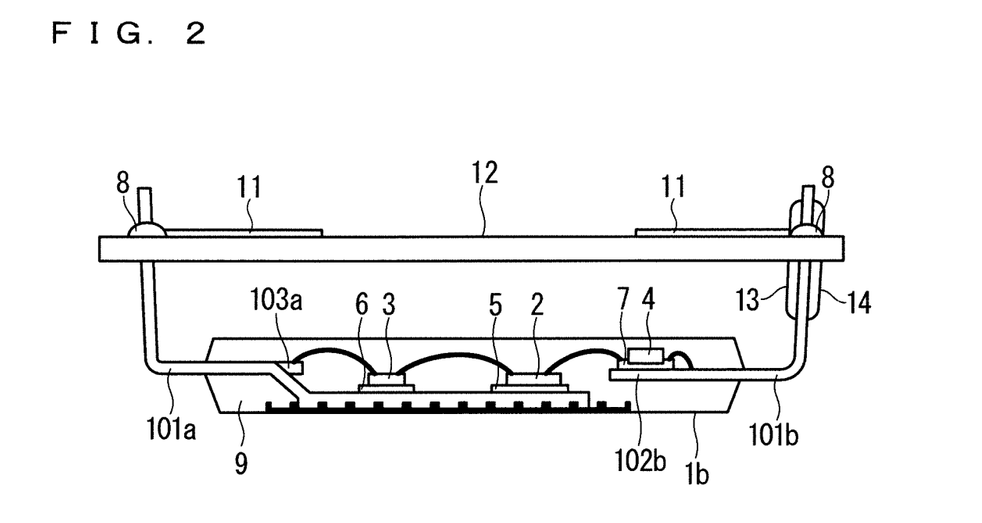
FIG. 2 is a cross-sectional view of a semiconductor device according to the second embodiment.

FIG. 2 is a cross-sectional view of a semiconductor device 1*b* according to the second embodiment. The semiconductor device 1*b* is the same as the semiconductor device 1 according to the first embodiment, except for how the temperature indicating materials 13 and 14 are provided. In the present embodiment as well, the temperature indicating material 14 is reversible, and the temperature indicating material 13 is an irreversible temperature indicating material.

As illustrated in FIG. 2, the part where the irreversible temperature indicating material 13 is provided may not only be the base end part of the lead terminals 100. By providing the irreversible temperature indicating material 13 on a wide range of the surface of the lead terminals 100, even when the color of a part of the irreversible temperature indicating material 13 is changed at the time of soldering, a history of temperatures during operation can be kept by another part.

The semiconductor device 1b according to the present embodiment has a structure in which the colors of the temperature indicating materials 13 and 14 are changed with the temperature of the control ICs 4. As illustrated in FIG. 2, the temperature indicating material 13 and the temperature indicating material 14 are provided on the same lead terminal 101b joined to the control IC 4 with the die pad 102b.

The power semiconductor module has, depending on a product, a temperature output function of outputting information of the temperature of the control ICs 4 as a voltage and giving feedback to a micro controller unit (MCU) or the like so as to fulfill a protection function.

The color of the irreversible temperature indicating material 13 changes at temperature that is higher than the temperature at which the protection function is fulfilled. The temperature at which the color of the reversible temperature indicating material 14 changes can be freely selected according to purposes.

When the reversible temperature indicating material 14 is a material whose color changes at temperature that is higher than the temperature at which the protection function is fulfilled, the change of the color of the temperature indicating material 14 before the fulfillment of the protection function leads to confirmation that the temperature output function of the semiconductor device 1b cannot be correctly used at the time or that failure or the like occurs.

When the reversible temperature indicating material 14 is a material whose color changes at temperature that is lower than the temperature at which the protection function is fulfilled, operation of the temperature output function without initial failure or aging can be continuously visualized and confirmed owing to the reversible temperature indicating material.

Further, when the color of the irreversible temperature indicating material 13, whose color changes at temperature that is higher than the temperature at which the protection function is fulfilled, changes before the fulfillment of the protection function, incorrect use of the temperature output function of the semiconductor device 1b or occurrence of failure or the like can be kept as a history.

C. Third Embodiment

Figure 3:
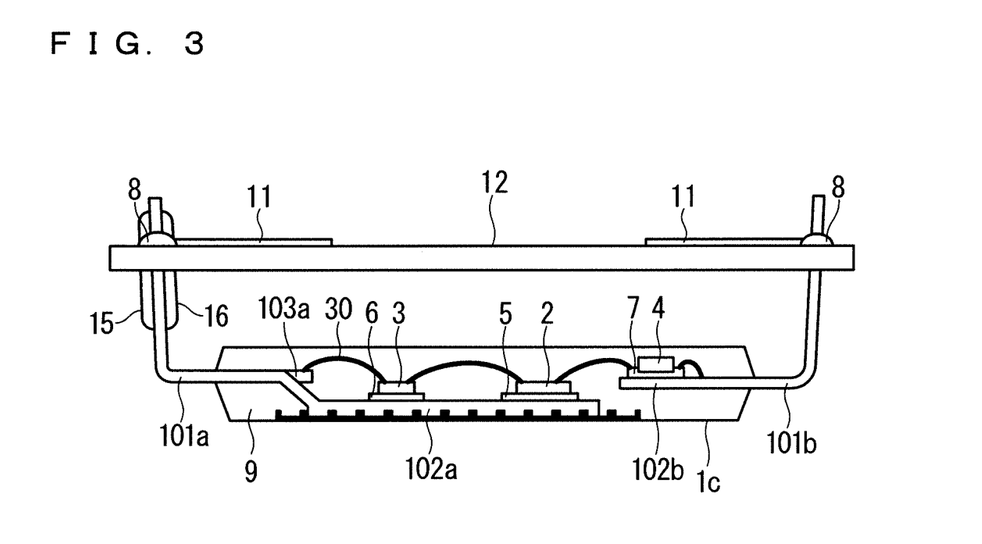
FIG. 3 is a cross-sectional view of a semiconductor device according to the third embodiment.

FIG. 3 is a cross-sectional view of a semiconductor device 1c according to the third embodiment.

The semiconductor device 1c has a structure in which both of a reversible temperature indicating material 15 and an irreversible temperature indicating material 16 are applied or attached to the same lead terminal 101a including the die pad 102a joined to the power semiconductor chips 2 and 3.

With the temperature output function described in the second embodiment, the temperature of the control ICs 4 is output as a voltage. However, when a sudden temperature rise of the power semiconductor chips 2 and 3 is caused due to malfunction or the like inside the semiconductor device 1, for example, it is conceivable that element breakdown of the power semiconductor chips 2 and 3 and the control ICs 4 is caused, inhibiting acquisition of temperature information with the temperature output function.

By applying or attaching the reversible and irreversible temperature indicating materials 15 and 16 to the lead terminal 101a joined to the power semiconductor chips 2 and 3, with the reversible temperature indicating material 15, temperature information of the power semiconductor chips 2 and 3 being temperature higher than the control ICs 4 can be continuously visualized, and with the irreversible temperature indicating material 16, a history of temperatures can be kept for the sudden temperature rise of the power semiconductor chips 2 and 3 that may not be able to be acquired with the temperature output function of the control ICs 4.

Further, the reversible and irreversible temperature indicating materials may be provided not on the surface of the lead terminal 101a but of the lead terminal 103a connected to the power semiconductor chips 2 and 3 with the wire 30, so that the sudden temperature rise of the lead terminal 103a may be continuously visualized, and may further be kept as a history.

D. Fourth Embodiment

Figure 4A:
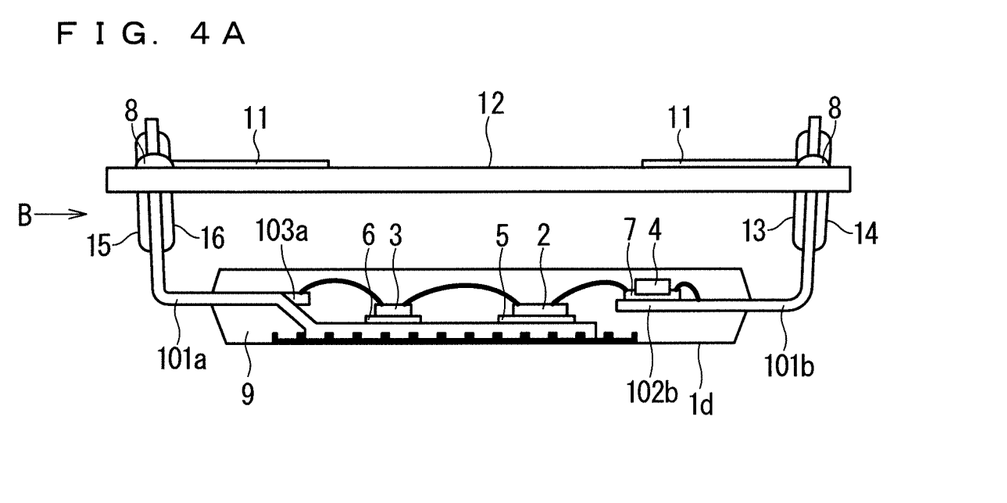
FIG. 4A is a cross-sectional view of a semiconductor device according to the fourth embodiment.
Figure 4B:
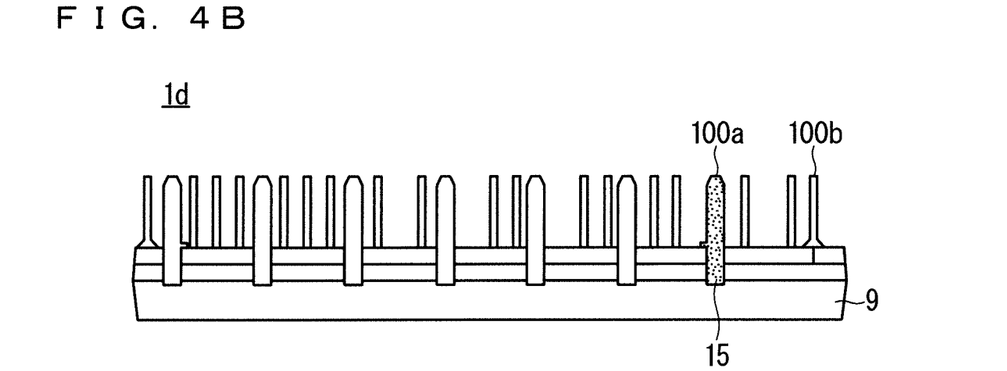
FIG. 4B is a side view of the semiconductor device according to the fourth embodiment.

FIG. 4A is a cross-sectional view of a semiconductor device 1d according to the fourth embodiment, and FIG. 4B is a side view of the semiconductor device 1d according to the fourth embodiment as seen from the side of the power semiconductor chips 2 and 3, that is, from the side indicated by the arrow B of FIG. 4A.

The semiconductor device 1d has the same configuration as that of the semiconductor device 1, except for the disposition of each of the lead terminals 100a and the lead terminals 100b, and how the temperature indicating materials are provided.

The semiconductor device 1d has a structure in which the reversible and irreversible temperature indicating materials are applied or attached to both surfaces of one lead terminal 100.

Each lead terminal usually has a flat plate-like shape, and includes one main surface, and another main surface being a main surface located on the opposite side of the one main surface. In the present embodiment, the reversible temperature indicating material is applied or attached to the one main surface of a certain lead terminal 100, and the irreversible temperature indicating material is applied or attached to the another main surface of the certain lead terminal 100. Further, the irreversible temperature indicating material is not provided on the one main surface, and the reversible temperature indicating material is not provided on the another main surface. In this manner, the temperature indicating materials are provided on both the main surfaces of the lead terminal 100, so as to cause the colors to be changed for different purposes. The number of lead terminals 100 provided with the reversible temperature indicating material on one main surface and the irreversible temperature indicating material on another main surface may be any number. FIG. 4A illustrates a case in which each of the lead terminal 101a and the lead terminal 101b is provided with the reversible temperature indicating material on one main surface and the irreversible temperature indicating material on another main surface.

Either of the reversible and irreversible temperature indicating materials may be applied or attached to either of the main surfaces. Note that it is difficult to check the surface on the semiconductor device 1*d* side, such as the surface on which the temperature indicating material 13 and the temperature indicating material 16 are provided in FIG. 4A, after the semiconductor device 1*d* is mounted on the substrate 12. Thus, it is desirable that the reversible temperature indicating material be applied or attached to a surface that faces outward when the semiconductor device 1*d* is mounted on the substrate 12 as with the case of the temperature indicating material 14 and the temperature indicating material 15, and the irreversible temperature indicating material be applied or attached to the back surface thereof as with the case of the temperature indicating material 13 and the temperature indicating material 16.

By applying or attaching the reversible temperature indicating material to one main surface of one lead terminal 100 and the irreversible temperature indicating material to another main surface, the area in which one temperature indicating material is applied or attached is increased, which allows for easier checking of the state of the temperature indicating materials than when both of the reversible and irreversible temperature indicating materials are provided on one surface.

E. Fifth Embodiment

Figure 5A:
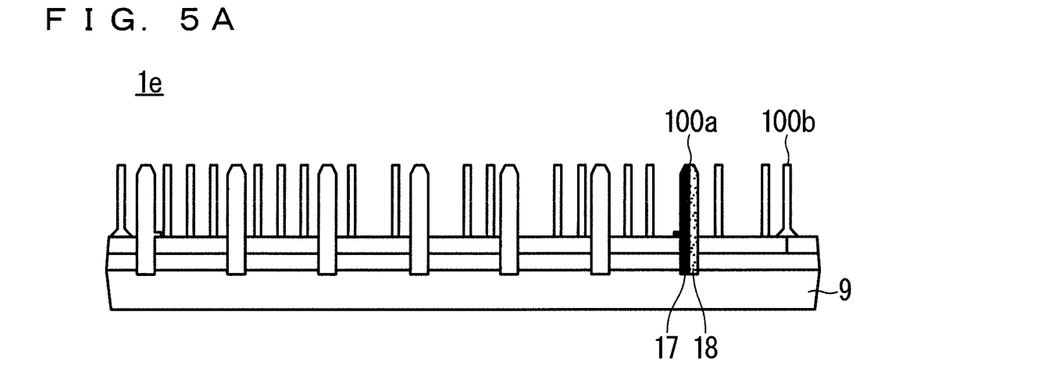
FIGS. 5A and 5B are side views of a semiconductor device according to the fifth embodiment.
Figure 5B:
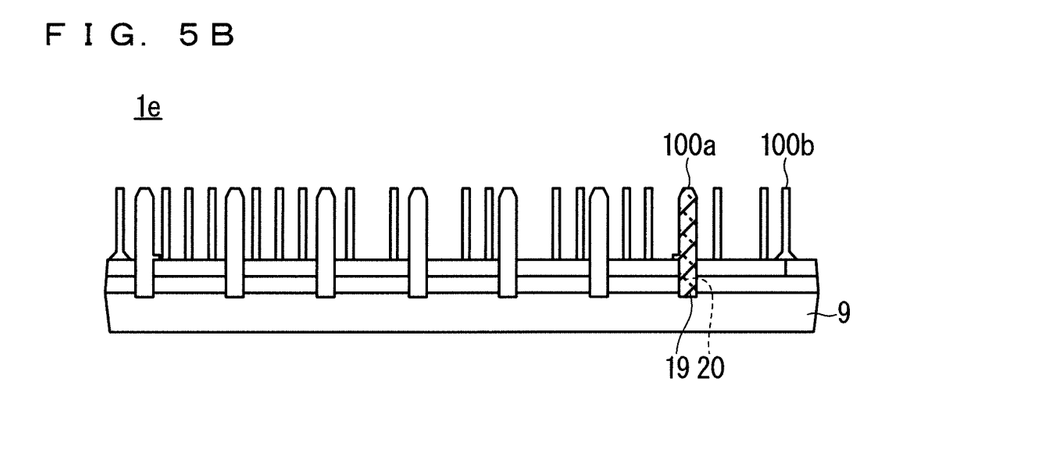

FIG. 5A and FIG. 5B are each of side view of a semiconductor device 1*e* according to the fifth embodiment.

In FIG. 5A, a reversible temperature indicating material 17 and an irreversible temperature indicating material 18 are respectively applied or attached to two regions obtained by vertically dividing one side of an exposed surface part of the lead terminal 100. In other words, the reversible temperature indicating material 17 is provided on one region out of two regions obtained by dividing the exposed surface part of one main surface of the lead terminal 100 by a boundary along a direction in which the lead terminal 100 projects from the mold resin 9, and the irreversible temperature indicating material 18 is provided on the other region of the two regions. At color change temperature or higher, the colors of the reversible temperature indicating material 17 and the irreversible temperature indicating material 18 change into different colors.

In FIG. 5B, a reversible temperature indicating material 19 and an irreversible temperature indicating material 20 are provided on the exposed surface part of one main surface of the lead terminal 100, with the temperature indicating materials each having such a stripe pattern as to form a mesh pattern being combined together. At color change temperature or higher, the colors of the reversible temperature indicating material 19 and the irreversible temperature indicating material 20 change into different colors.

In the present embodiment, in this manner, both of the reversible temperature indicating material and the irreversible temperature indicating material are provided on one certain main surface of the lead terminal 100.

Because it is difficult to check the surface on the side of the semiconductor device 1*e* after the semiconductor device 1*e* is mounted on the substrate, it is preferable that the reversible and irreversible temperature indicating materials be applied or attached to the surface facing outward when the semiconductor device 1*e* is mounted on the substrate.

The reversible temperature indicating material and the irreversible temperature indicating material can be applied or attached to the exposed part of the lead terminal 100 being divided into upper and lower parts, that is, divided into parts closer to and farther from the mold resin 9. However, it is conceivable that temperature distribution is different between the parts closer to and farther from the mold resin 9. By applying or attaching the temperature indicating materials through vertical division as illustrated in FIG. 5A or in a mesh pattern as illustrated in in FIG. 5B, the difference of temperatures between the reversible temperature indicating material 17 and the irreversible temperature indicating material 18 can be reduced.

In the present embodiment, the reversible and irreversible temperature indicating materials are applied or attached to one surface of the lead terminal 100, and thus the state of each temperature indicating material can be more easily checked than when the reversible and irreversible temperature indicating materials are applied or attached to both the surfaces of the lead terminal 100.

F. Sixth Embodiment

Figure 6:
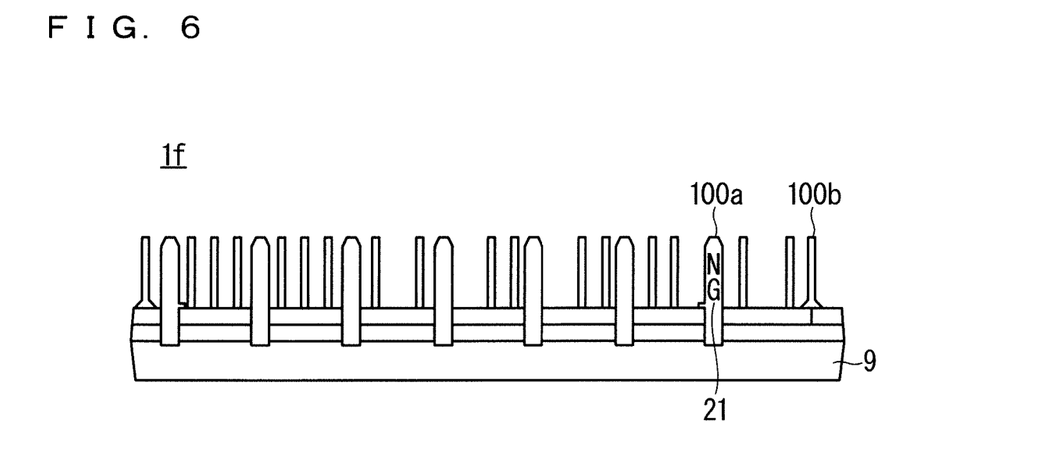
FIG. 6 is a side view of a semiconductor device according to the sixth embodiment.

FIG. 6 is a side view of a semiconductor device 1*f* according to the sixth embodiment as seen from the side of the power semiconductor chips 2 and 3.

By providing a temperature indicating material 21 in such a manner that letter(s) appear along with a rise in temperature when the temperature indicating material 21 is provided on the lead terminal 100, a greater appeal can be made to the visual sense rather than when the color of the temperature indicating material is simply caused to change. The letter may be a number that indicates temperature, for example. FIG. 6 illustrates a case in which the temperature indicating material 21 is provided so that the letters "NG" appear along with a rise in temperature.

The temperature indicating material 21 is an irreversible temperature indicating material, for example, and the reversible temperature indicating material is provided on a surface that is opposite to the surface on which the temperature indicating material 21 is provided in the lead terminal 100 in which the temperature indicating material 21 is provided. Alternatively, the temperature indicating material 21 is a reversible temperature indicating material, for example, and an irreversible temperature indicating material is provided on a surface that is opposite to the surface on which the temperature indicating material 21 is provided in the lead terminal 100 in which the temperature indicating material 21 is provided. In this manner, at least any one of the reversible temperature indicating material and the irreversible temperature indicating material is provided on the surface of the lead terminal 100 so that letters appear along with a rise in temperature. Both of the reversible temperature indicating material and the irreversible temperature indicating material may be provided so that letters appear on the surface of the lead terminal 100 along with a rise in temperature.

G. Seventh Embodiment

The first to sixth embodiments illustrate a case in which both of the reversible temperature indicating material and the irreversible temperature indicating material are provided in one lead terminal 100. However, the reversible temperature indicating material may be provided on one lead terminal 100 and the irreversible temperature indicating material may be provided on another lead terminal 100. With such a configuration as well, the temperature inside the mold resin 9 can be continuously visualized, and can further be kept as a history.

Further, where the reversible temperature indicating material and the irreversible temperature indicating material are provided may not be the surface of the lead terminal 100, and may be a surface of a suspension lead that is not used for electric connection of the semiconductor device. In addition, where the reversible temperature indicating material and the irreversible temperature indicating material are provided may be, more generally, a surface of a member (hereinafter referred to as a member 200) that is partially sealed by the mold resin 9 and has a part thereof being exposed from the mold resin 9.

In other words, the semiconductor device may include the mold resin 9 integrally sealing at least one semiconductor chip, and at least one member 200, each being partially sealed by the mold resin 9 and having a part thereof being exposed from the mold resin 9. Each of the reversible temperature indicating material and the irreversible temperature indicating material may be provided on a surface of any one of the at least one member 200. In such a case as well, by providing the reversible temperature indicating material and the irreversible temperature indicating material in the member 200 by using a member having thermal conductivity higher than thermal conductivity of the mold resin 9 as the member 200, the temperature inside the mold resin 9 can be visualized for two or more different purposes, as in the case described in the first to sixth embodiments. The lead terminal 100 according to the first to sixth embodiments is an example of the member 200.

For example, by using a member having thermal conductivity higher than thermal conductivity of the lead terminal 100 as the member 200, the temperature inside the mold resin 9 can be more accurately visualized.

Further, it is conceivable that one member 200 is exposed from the mold resin 9 at a plurality of positions; however, in order to reduce difference of temperatures, it is desirable that both of the reversible temperature indicating material and the irreversible temperature indicating material be provided on a continuous exposed surface from the mold resin 9 of the same certain member 200.

Further, the first to sixth embodiments illustrate a case in which both of the reversible and irreversible temperature indicating materials are provided on the exposed surface of the lead terminal 100. However, the irreversible temperature indicating material may be provided on a surface of a part that is not exposed from the mold resin 9.

Note that each embodiment can be freely combined, and each embodiment can be modified or omitted as appropriate.

While the disclosure has been shown and described in detail, the foregoing description is in all aspects illustrative and not restrictive. It is therefore understood that numerous modifications and variations can be devised.

What is claimed is:

1. A semiconductor device comprising:
   at least one semiconductor chip;
   a sealing material integrally sealing the at least one semiconductor chip;
   at least one member, each being partially sealed by the sealing material and having a part being exposed from the sealing material;
   a reversible temperature indicating material; and
   an irreversible temperature indicating material, wherein
   each of the reversible temperature indicating material and the irreversible temperature indicating material is provided on a surface of any one of the at least one member.

2. The semiconductor device according to claim 1, wherein
   the reversible temperature indicating material is provided on a surface of a part exposed from the sealing material of any one of the at least one member.

3. The semiconductor device according to claim 1, wherein
   each of the reversible temperature indicating material and the irreversible temperature indicating material is provided on a surface of a part exposed from the sealing material of any one of the at least one member.

4. The semiconductor device according to claim 3, wherein
   the irreversible temperature indicating material is provided on the at least one member whose part is exposed in a manner of projecting from the sealing material, on a surface of a part closer to the sealing material than to a tip end of the part projecting from the sealing material.

5. The semiconductor device according to claim 1, wherein
   both of the reversible temperature indicating material and the irreversible temperature indicating material are provided on a surface of a same certain one of the at least one member.

6. The semiconductor device according to claim 5, wherein
   both of the reversible temperature indicating material and the irreversible temperature indicating material are provided on a continuous exposed surface from the sealing material of the same certain one of the at least one member.

7. The semiconductor device according to claim 5, wherein
   the same certain one of the at least one member is joined to any one of the at least one semiconductor chip.

8. The semiconductor device according to claim 5, wherein
   the same certain one of the at least one member is joined to a control IC as any one of the at least one semiconductor chip.

9. The semiconductor device according to claim 8, wherein
   the semiconductor device has a temperature output function of outputting information of temperature of the control IC as a voltage.

10. The semiconductor device according to claim 5, wherein
    the same certain one of the at least one member is connected to a power semiconductor chip as any one of the at least one semiconductor chip with a wire.

11. The semiconductor device according to claim 5, wherein
    the same certain one of the at least one member is joined to a power semiconductor chip as any one of the at least one semiconductor chip.

12. The semiconductor device according to claim 5, wherein
    the same certain one of the at least one member includes one main surface, and another main surface being a main surface located on an opposite side of the one main surface, and
    the reversible temperature indicating material is provided on the one main surface, and the irreversible temperature indicating material is provided on the another main surface.

13. The semiconductor device according to claim 12, wherein
    the reversible temperature indicating material is provided and the irreversible temperature indicating material is not provided on the one main surface, and the irreversible temperature indicating material is provided and the reversible temperature indicating material is not provided on the another main surface.

14. The semiconductor device according to claim 5, wherein
both of the reversible temperature indicating material and the irreversible temperature indicating material are provided on one certain main surface of the same certain one of the at least one member.

15. The semiconductor device according to claim 14, wherein
the reversible temperature indicating material is provided in one region out of two regions obtained by dividing an exposed surface part of the one certain main surface of the same certain one of the at least one member by a boundary along a direction in which the same certain one of the at least one member projects from the sealing material, and the irreversible temperature indicating material is provided in another region of the two regions.

16. The semiconductor device according to claim 14, wherein
the reversible temperature indicating material and the irreversible temperature indicating material are provided on the one certain main surface of the same certain one of the at least one member, with the reversible temperature indicating material and the irreversible temperature indicating material each having a stripe pattern facing different directions so as to form a mesh pattern being combined together.

17. The semiconductor device according to claim 1, wherein
at least any one of the reversible temperature indicating material and the irreversible temperature indicating material is provided on a surface of the at least one member so that a letter appears along with a rise in temperature.

18. The semiconductor device according to claim 1, wherein
the at least one member has thermal conductivity higher than thermal conductivity of the sealing material.

19. The semiconductor device according to claim 1, wherein
the at least one member is a lead terminal.

20. The semiconductor device according to claim 1, further comprising
a lead terminal, wherein
the at least one member has thermal conductivity higher than thermal conductivity of the lead terminal.

* * * * *